(12) United States Patent
Li et al.

(10) Patent No.: US 11,805,670 B2
(45) Date of Patent: Oct. 31, 2023

(54) PACKAGING STRUCTURE FOR DISPLAY SUBSTRATE, PACKAGING METHOD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhen Li, Beijing (CN); Shasha Zhu, Beijing (CN); Yulin Wang, Beijing (CN); Rui Hou, Beijing (CN); Yide Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 435 days.

(21) Appl. No.: 17/286,263

(22) PCT Filed: Sep. 21, 2020

(86) PCT No.: PCT/CN2020/116498
§ 371 (c)(1),
(2) Date: Apr. 16, 2021

(87) PCT Pub. No.: WO2021/073363
PCT Pub. Date: Apr. 22, 2021

(65) Prior Publication Data
US 2022/0006053 A1     Jan. 6, 2022

(30) Foreign Application Priority Data

Oct. 17, 2019  (CN) .......................... 201910985655.1

(51) Int. Cl.
H10K 50/844   (2023.01)
H10K 71/00    (2023.01)
H10K 59/12    (2023.01)

(52) U.S. Cl.
CPC .......... *H10K 50/844* (2023.02); *H10K 71/00* (2023.02); *H10K 59/12* (2023.02)

(58) Field of Classification Search
CPC ....... H10K 50/844–8445; H10K 59/873–8731
See application file for complete search history.

(56) References Cited

U.S. PATENT DOCUMENTS

2017/0077445 A1   3/2017  Han
2017/0125732 A1*  5/2017  Lee ..................... H10K 50/844
(Continued)

FOREIGN PATENT DOCUMENTS

CN    106129264 A    11/2016
CN    106935732 A     7/2017
(Continued)

OTHER PUBLICATIONS

First Office Action for Chinese Application No. 201910985655.1, dated Mar. 3, 2021, 9 Pages.
(Continued)

*Primary Examiner* — Daniel P Shook
(74) *Attorney, Agent, or Firm* — BROOKS KUSHMAN P.C.

(57) ABSTRACT

This disclosure provides a packaging structure for a display substrate, a packaging method and a display device. The packaging structure for the display substrate includes a base substrate, a light-emitting device arranged on the base substrate, and a packaging thin film covering the light-emitting device. The packaging thin film includes an inorganic thin film and an organic thin film that are laminated, and the organic thin film is arranged on a surface of the (Continued)

inorganic thin film away from the base substrate. The packaging thin film includes a central region and a peripheral region surrounding the central region, the inorganic thin film located in the central region has surface energy greater than that of the inorganic thin film in the peripheral region, and the organic thin film in the central region has a thickness less than that of the organic thin film in the peripheral region.

20 Claims, 3 Drawing Sheets

(56) References Cited

U.S. PATENT DOCUMENTS

2017/0288172 A1  10/2017  Yang et al.
2021/0066655 A1   3/2021  Jiang et al.

FOREIGN PATENT DOCUMENTS

| CN | 106941112 A | 7/2017 |
| CN | 104882565 B | 10/2017 |
| CN | 107507931 A | 12/2017 |
| CN | 107689424 A | 2/2018 |
| CN | 110518043 A | 11/2019 |
| CN | 110707236 A | 1/2020 |

OTHER PUBLICATIONS

International Search Report and Written Opinion for Application No. PCT/CN2020/116498, dated Dec. 25, 2020, 8 Pages.

* cited by examiner

PACKAGING STRUCTURE FOR DISPLAY SUBSTRATE, PACKAGING METHOD AND DISPLAY DEVICE

CROSS-REFERENCE TO RELATED APPLICATIONS

This application is the U.S. national phase of PCT Application No. PCT/CN2020/116498 filed on Sep. 21, 2020, which claims priority to Chinese Patent Application No. 201910985655.1 filed on Oct. 17, 2019, which are incorporated herein by reference in their entireties.

TECHNICAL FIELD

The present disclosure relates to the field of display technology, in particular, to a packaging structure for a display substrate, a packaging method for a display substrate, and a display device including the packaging structure.

BACKGROUND

An organic light-emitting diode (OLED) device has become a very competitive and promising next-generation display technology due to its advantages, such as all-solid-state structure, high brightness, wide viewing angle, fast response, and flexible display. As compared with a liquid crystal display (LCD) display technology, the organic light-emitting materials used in OLED display technology are more sensitive to water and oxygen. In order to meet the basic requirement for the service life, the OLED packaging structure usually has a low permeability to water and oxygen. Therefore, there are very high requirements for the packaging of OLED.

SUMMARY

In one aspect, the present disclosure provides a packaging structure for a display substrate, including a base substrate, a light-emitting device arranged on the base substrate, and a packaging thin film covering the light-emitting device, in which the packaging thin film includes an inorganic thin film and an organic thin film that are laminated, and the organic thin film is arranged on a surface of the inorganic thin film away from the base substrate, and in which the packaging thin film includes a central region and a peripheral region surrounding the central region, the inorganic thin film located in the central region has surface energy greater than that of the inorganic thin film in the peripheral region, and the organic thin film in the central region has a thickness less than that of the organic thin film in the peripheral region.

Optionally, an orthogonal projection of a display region of the display substrate on the base substrate falls within an orthogonal projection of the central region on the base substrate.

Optionally, the packaging structure further includes at least one barrier structure arranged at an edge of the display substrate and surrounding the peripheral region.

Optionally, at least two barrier structures are arranged at the edge of the display substrate, and the barrier structures have heights increasing successively along a direction from a center of the display substrate to a peripheral region of the display substrate.

Optionally, a difference between a static water contact angle on a surface of the inorganic thin film in the peripheral region and a static water contact angle on a surface of the inorganic thin film in the central region is at least 15°.

Optionally, a static water contact angle on a surface of the inorganic thin film in the peripheral region is in a range from 40° to 50°, and a static water contact angle on a surface of the inorganic thin film in the central region is less than 30°.

Optionally, the static water contact angle on the surface of the inorganic thin film in the peripheral region is in a range from 45° to 50°, and the static water contact angle on the surface of the inorganic thin film in the central area is in a range from 10° to 25°.

Optionally, the inorganic thin film is made from at least one selected from silicon nitride $SiN_x$ ($0 < x \leq 4/3$), silicon oxide $SiO_x$ ($0 < x \leq 2$), silicon oxynitride SiON and aluminium oxide $AlO_x$ ($0 < x \leq 3/2$).

Optionally, the organic thin film is prepared from at least one selected from an acrylate material, an epoxy resin material, and a polyurethane material.

In another aspect, the present disclosure further provides a display device, including the packaging structure as described above.

In still another aspect, the present disclosure also provides a packaging method for a display substrate, including: forming an inorganic thin film on a base substrate on which a light-emitting device is formed; performing a treatment on a surface of the inorganic thin film, so that the inorganic thin film located in a central region has surface energy greater than that of the inorganic thin film in a peripheral region, in which the peripheral region surrounds the central region; inkjet printing a rheological organic material on the inorganic thin film, in which a static contact angle between the rheological organic material and the central region is less than a static contact angle between the rheological organic material and the peripheral region; and curing the rheological organic material.

Optionally, the method further includes forming at least one barrier structure on an edge of the display substrate before the forming the inorganic thin film.

Optionally, at least two barrier structures are formed at the edge of the display substrate, and the barrier structures have heights increasing successively along a direction from a center of the display substrate to a peripheral region of the display substrate.

Optionally, the performing the treatment on the surface of the inorganic thin film includes: placing a mask plate parallel to the base substrate on a surface of the inorganic thin film away from the base substrate, in which the mask plate has an opening corresponding to the central region, and an orthogonal projection of the opening on the inorganic thin film coincides with the central region; and performing an ultraviolet light irradiation or a plasma treatment on a surface of the inorganic thin film covered with the mask plate, so that the inorganic thin film exposed from the opening of the mask plate is subjected to the ultraviolet light irradiation or the plasma treatment.

Optionally, a difference between a static water contact angle on a surface of the inorganic thin film in the peripheral region and a static water contact angle on a surface of the inorganic thin film in the central region is at least 15°.

Optionally, static water contact angle on a surface of the inorganic thin film in the peripheral region is in a range from 40° to 50°, and a static water contact angle on a surface of the inorganic thin film in the central region is less than 30°.

Optionally, the static water contact angle on the surface of the inorganic thin film in the peripheral region is in a range from 45° to 50°, and the static water contact angle on the surface of the inorganic thin film in the central area is in a range from 10° to 25°.

Optionally, the inorganic thin film is made from at least one selected from silicon nitride $SiN_x$ ($0<x\leq4/3$), silicon oxide $SiO_x$ ($0<x\leq2$), silicon oxynitride SiON and aluminium oxide $AlO_x$ ($0<x\leq3/2$).

Optionally, the organic thin film is prepared from at least one selected from an acrylate material, an epoxy material, and a polyurethane material.

DETAILED DESCRIPTION

The technical problems, the technical solutions, and the advantages of the present invention will be more clearly described in combination with the drawings and specific embodiments.

Thin-film packaging technology greatly meets the requirements for the performance of the OLED packaging. The OLED structure packaged by multi-layer stacked thin film sequentially includes from the inside to the outside: 1) a base substrate, such as a glass substrate or a flexible substrate; 2) a light-emitting unit, including an organic light-emitting unit having R, G, and B three-color pixel arrays; 3) an inorganic-organic cross-stacked packaging thin film structure; and 4) a barrier layer, made from a flexible material and sealing and protecting the entire organic light-emitting unit.

At present, in the multilayer-stacked structure composed of inorganic layer/organic layer/inorganic layer, the inorganic layer is mainly deposited by plasma enhanced chemical vapor deposition (PECVD) and atomic layer deposition (ALD), so as to meet the requirement for efficient water and oxygen barrier properties; and the organic layer is mainly formed by inkjet printing (IJP). Since IJP technology does not require a mask plate during patterning and has high process stability, it is becoming more and more widely used in the packaging process of organic layer/inorganic layer cross-stacked thin film.

Figure 1:
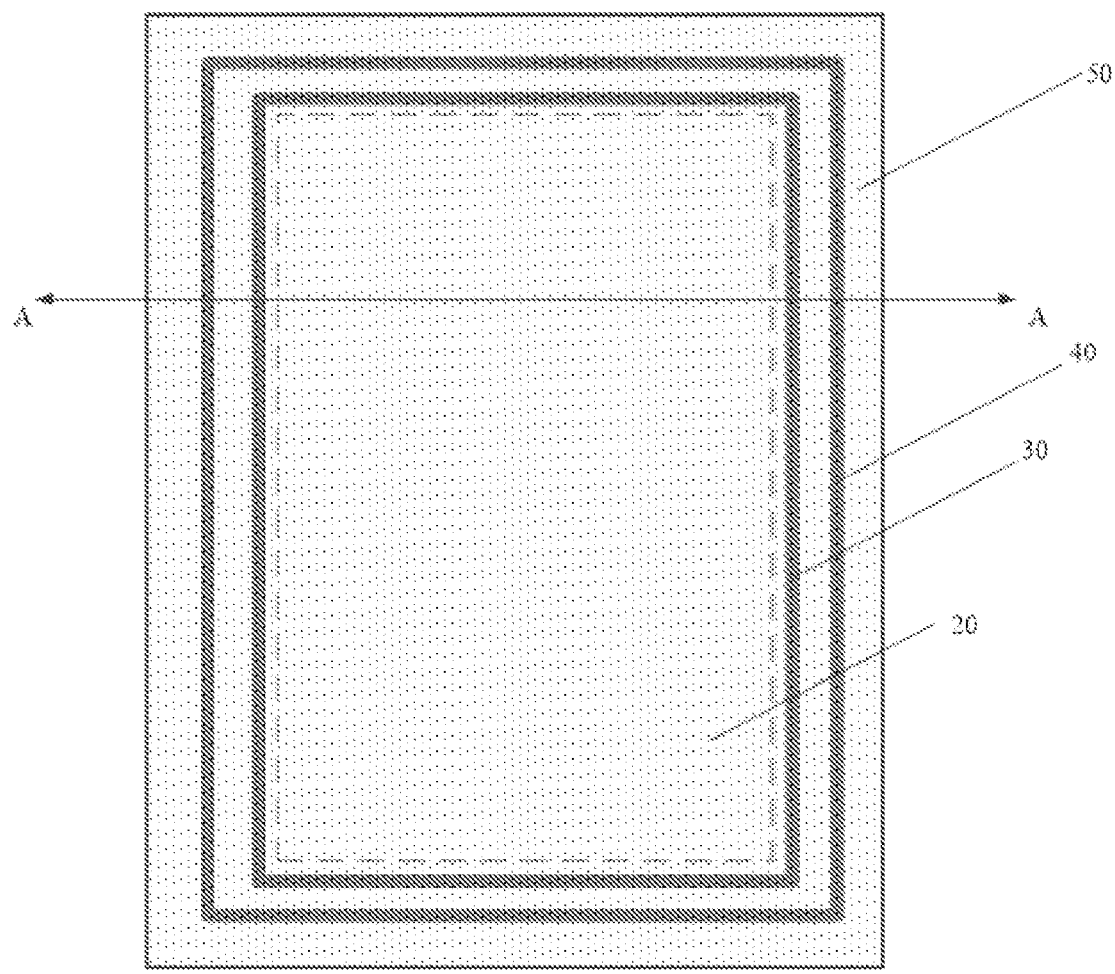
FIG. 1 is a schematic plan view of a packaging structure for a display substrate in the related art.
Figure 2:
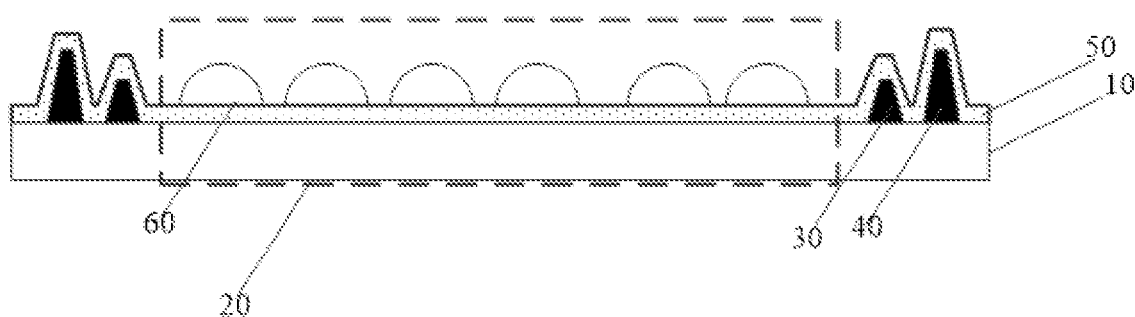
FIG. 2 is a schematic view showing the cross section taken along the direction AA in FIG. 1.

When IJP technology is used for coating the organic ink, the leveling characteristics of the organic ink on the coating surface have a significant impact on the thickness of the thin film packaging structure and the shape of the packaging edge. In the inkjet printing of the organic ink, uneven ink diffusion appearing on the surface of the inorganic layer, uneven edges of the organic ink layer, ink flowing, and the like are not conducive to the lightweightness of the OLED device and the development of the extremely narrow frame. Usually, if the flowability of the organic ink is poor, the organic ink will diffuse unevenly. This leads to defects on the surface of the organic thin film formed after curing, thereby further affecting the packaging performance. If the flowability of the organic ink is stronger, the thickness of the organic thin film formed by the organic ink is smaller, the leveling time is shorter, and the organic thin film formed after curing has fewer defects. However, the organic ink having the stronger flowability will also lead to a longer the leveling distance, which is not conducive to the narrow frame of the display device. As shown in FIGS. 1 and 2, the inorganic thin film 50 has a surface having low surface energy, and the flowability of the organic ink 60 is poor in the region 20 having low surface energy. In order to obtain a good leveling effect, the related art generally increases the thickness of the organic thin film, inkjet prints more organic ink 60, and arranges barriers 30 and 40 on the edges of the display substrate. However, this process will increase the area of the non-display region, which is not conducive to the development trend of lightweightness and bendability of the display device.

In view of the above technical problem, the present disclosure provides a packaging structure of a display substrate, a packaging method for a display substrate, and a display device including the packaging structure. The packaging structure of the present disclosure can reduce the thickness of the organic thin film, and the display device of the present disclosure is beneficial to realize the lightweightness and the extremely narrow frame.

An embodiments of the present disclosure provides a packaging structure for a display substrate, including a base substrate, a light-emitting device arranged on the base substrate, and a packaging thin film covering the light-emitting device, in which the packaging thin film includes an inorganic thin film and an organic thin film that are laminated, and the organic thin film is arranged on a surface of the inorganic thin film away from the base substrate, and in which the packaging thin film includes a central region and a peripheral region surrounding the central region, the inorganic thin film located in the central region has surface energy greater than that of the inorganic thin film in the peripheral region, and the organic thin film in the central region has a thickness less than that of the organic thin film in the peripheral region.

In the above embodiments of the present disclosure, the surface of the inorganic thin film away from the base substrate includes a central region and a peripheral region surrounding the central region, and the surface energy of the central region is greater than that of the peripheral region, thereby forming a difference in the surface energy on the surface of the inorganic thin film. Therefore, after inkjet printing the rheological organic material on the inorganic thin film, the rheological organic material has a strong flowability in the central region, and can be spread and leveled quickly. This can effectively reduce the thickness of the organic thin film in the central region after curing, which is beneficial to realize the lightweightness of the display device. Moreover, the shorter the leveling time, the fewer defects in the organic thin film formed after curing. In addition, in the peripheral region, the flowability of the rheological organic material decreases. This can reduce the leveling distance of the rheological organic material, which is beneficial to realize the narrow frame of the display device.

Optionally, the central region corresponds to the display region of the display substrate. The display region of the display substrate refers to a region that is provided with a light-emitting element and emits light. Optionally, the area of the central region may be slightly greater than that of the display region, equal to that of the display region, or slightly less than that of the display region. In a specific embodiment, an orthogonal projection of a display region of the display substrate on the base substrate falls within an orthogonal projection of the central region on the base substrate. Therefore, the thickness of the organic thin film in the display region of the display substrate is small, which is beneficial to realize the lightweightness and the bendability of the display device. The peripheral region surrounds the central region. Optionally, the peripheral region may be all other regions of the display substrate than the central region, or may be the region between the central region and the barrier structure.

In order to further reduce the leveling distance of the rheological organic material and to ensure the edge performance of the organic thin film, the display substrate may optionally further include at least one barrier structure arranged at the edge of the display substrate. The barrier structure surrounds the peripheral region.

In an embodiment of the present disclosure, a plurality of barrier structures or only one barrier structure may be provided on the edge of the display substrate. The flowability of the rheological organic material in the peripheral region is reduced, which can reduce the leveling distance of the rheological organic material without providing too many barrier structures. Therefore, the packaging structure of the present disclosure can reduce the number of barrier structures and realize the narrow frame design of the display substrate.

Optionally, at least two barrier structures are arranged at the edge of the display substrate, and the barrier structures have heights increasing successively along a direction from a center of the display substrate to a peripheral region of the display substrate. Such a barrier structure can form a stepped structure, which effectively prevents the rheological organic material from overflowing.

Optionally, a difference between a static water contact angle on a surface of the inorganic thin film in the peripheral region and a static water contact angle on a surface of the inorganic thin film in the central region is at least 10°. In order to ensure the sufficient leveling performance of the organic ink on the surface of the central region and the lightweightness of the organic thin film, the difference between the static water contact angle on the surface of the inorganic thin film in the peripheral region and the static water contact angle on the surface of the inorganic thin film in the central region is at least 12°, even at least 12°, at least 20°, or even at least 25°.

Optionally, the static water contact angle on the surface of the inorganic thin film in the peripheral region may be in a range from 40° to 70°, from 40° to 60°, from 42° to 50°, or even from 42° to 45°. This can ensure that the surrounding region has lower surface energy, effectively control the flow rate of the rheological organic material, and reduce the leveling distance of the rheological organic material. Optionally, the static water contact angle on the surface of the inorganic thin film in the central region may be less than 30°, or in a range from 3° to 30°, from 5° to 28°, from 10° to 25°, or even from 12° to 20°. This can ensure that the central region has relatively high surface energy, is quickly spread and leveled, and reduces the thickness of the organic thin film in the central region after curing.

In order to ensure the packaging effect, the inorganic thin film is made from an inorganic material having high density and good water and oxygen resistance. Optionally, the inorganic thin film is made from at least one selected from silicon nitride $SiN_x$ ($0<x\leq 4/3$), silicon oxide $SiO_x$ ($0<x\leq 2$), silicon oxynitride SiON and aluminium oxide $AlO_x$ ($0<x\leq 3/2$).

Optionally, the organic thin film may be prepared from at least one selected from an acrylate material, an epoxy material, and a polyurethane material. An acrylate material has good UV curing activity, excellent material toughness and easy modification. Therefore, the organic thin film is preferably made of an acrylate material.

An embodiment of the present disclosure further provides a display device including the display substrate as described above. The display device may include any product or component having a display function, such as a television, a display, a digital photo frame, a mobile phone, and a tablet computer. Optionally, the display device further includes a flexible circuit board, a printed circuit board, and a backplane.

An embodiment of the present disclosure further provides a packaging method for a display substrate, including: forming an inorganic thin film on a base substrate on which a light-emitting device is formed; performing a treatment on a surface of the inorganic thin film, so that the inorganic thin film located in a central region has surface energy greater than that of the inorganic thin film in a peripheral region, in which the peripheral region surrounds the central region; inkjet printing a rheological organic material on the inorganic thin film, in which a static contact angle between the rheological organic material and the central region is less than a static contact angle between the rheological organic material and the peripheral region; and curing the rheological organic material.

In this embodiment, the surface of the inorganic thin film away from the base substrate includes a central region and a peripheral region surrounding the central region, and the surface energy of the central region is greater than that of the peripheral region, thereby forming a difference in the surface energy on the surface of the inorganic thin film. Therefore, after inkjet printing the rheological organic material on the inorganic thin film, the rheological organic material has a strong flowability in the central region, and can be spread and leveled quickly. This can effectively reduce the thickness of the organic thin film in the central region after curing, which is beneficial to realize the lightweightness of the display device. Moreover, the shorter the leveling time, the fewer defects in the organic thin film formed after curing. In addition, in the peripheral region, the flowability of the rheological organic material decreases. This can reduce the leveling distance of the rheological organic material, which is beneficial to realize the narrow frame of the display device.

Optionally, the central region corresponds to the display region of the display substrate. The display region of the display substrate refers to a region that is provided with a light-emitting element and emits light. Optionally, the area of the central region may be slightly greater than that of the display region, equal to that of the display region, or slightly less than that of the display region. In a specific example, an orthogonal projection of a display region of the display substrate on the base substrate falls within an orthogonal projection of the central region on the base substrate. Therefore, the thickness of the organic thin film in the display region of the display substrate is small, which is beneficial to realize the lightweightness and the bendability of the display device. The peripheral region surrounds the central region. Optionally, the peripheral region may be all other regions of the display substrate than the central region, or may be the region between the central region and the barrier structure.

In order to further reduce the leveling distance of the rheological organic material and to ensure the edge performance of the organic thin film, the method optionally further includes forming at least one barrier structure on the edge of the display substrate. The barrier structure surrounds the peripheral region.

In this embodiment of the present disclosure, a plurality of barrier structures or only one barrier structure may be formed on the edge of the display substrate. The flowability of the rheological organic material in the peripheral region is reduced, which can reduce the leveling distance of the rheological organic material without providing too many barrier structures. Therefore, the packaging structure of the present disclosure can reduce the number of barrier structures and realize the narrow frame design of the display substrate.

Optionally, at least two barrier structures are formed at the edge of the display substrate, and the barrier structures have heights increasing successively along a direction from a center of the display substrate to a peripheral region of the display substrate. Such a barrier structure can form a stepped structure, which effectively prevents the rheological organic material from overflowing.

Before performing the treatment on the inorganic thin film, the entire surface of the inorganic thin film is a region having low surface energy. The surface energy of the central region can be increased by ultraviolet light irradiation and plasma bombardment. In a specific embodiment, the step of performing the treatment on the surface of the inorganic thin film includes: placing a mask plate parallel to the base substrate on a surface of the inorganic thin film away from the base substrate, in which the mask plate has an opening corresponding to the central region, and an orthogonal projection of the opening on the inorganic thin film coincides with the central region; and performing an ultraviolet light irradiation or a plasma treatment on a surface of the inorganic thin film covered with the mask plate, so that the inorganic thin film exposed from the opening of the mask plate is subjected to the ultraviolet light irradiation or the plasma treatment.

The longer the ultraviolet light irradiation or plasma treatment, the higher the surface energy of the central region. The time of ultraviolet light irradiation or plasma treatment can be adjusted according to the required thickness of the organic thin film.

This embodiment is not limited to increasing the surface energy of the central region through ultraviolet light irradiation or plasma treatment, and other methods can also be used to perform a treatment on the inorganic thin film, as long as the surface energy of the central region can be improved.

The technical solutions of the present disclosure will be further described below in conjunction with the accompanying drawings and specific embodiments.

Figure 3:
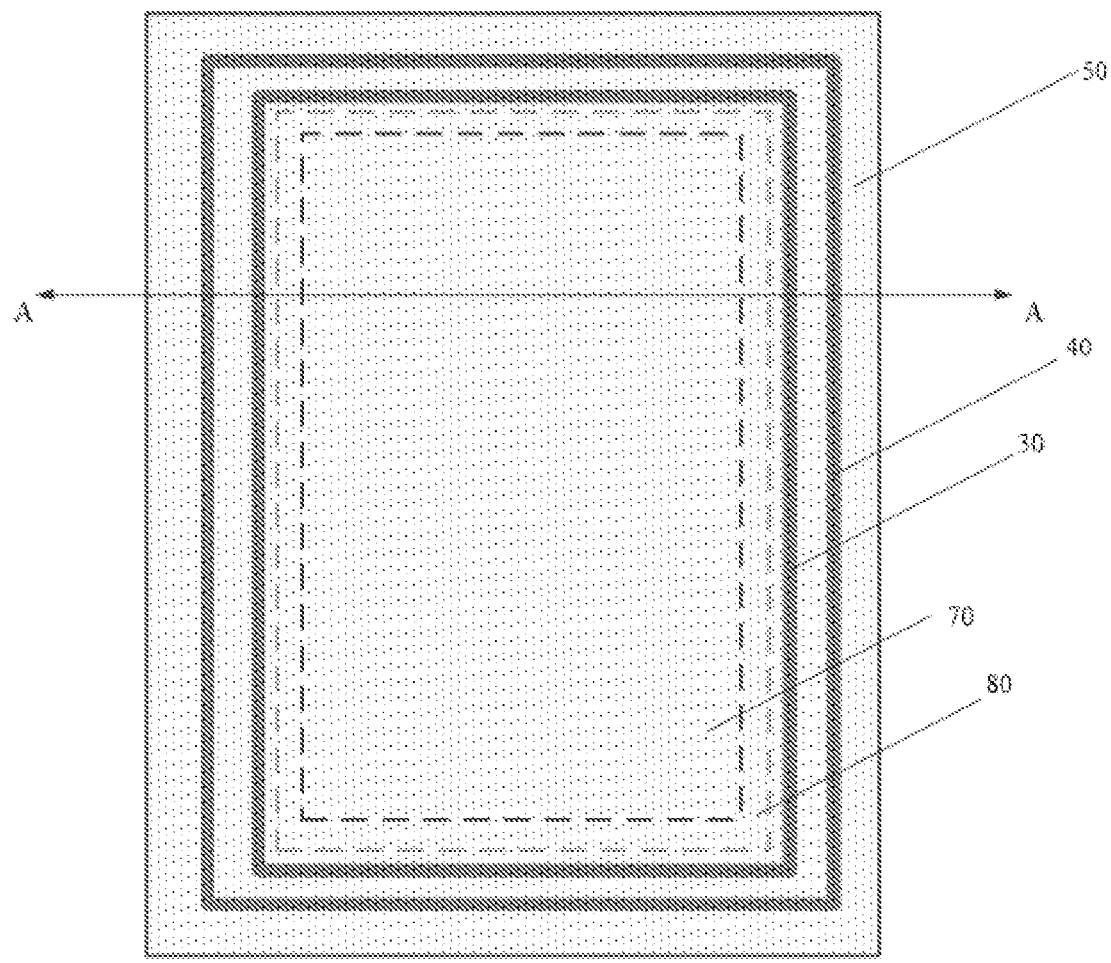
FIG. 3 is a schematic plan view showing a packaging structure for a display substrate according to an embodiments of the present disclosure.
Figure 4:
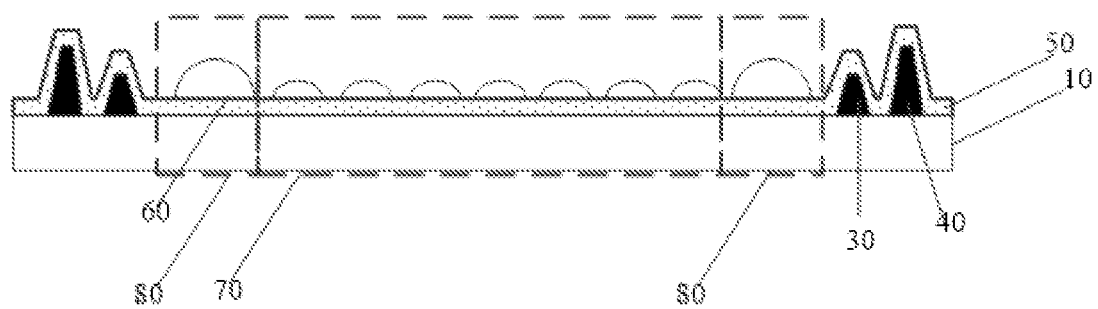
FIG. 4 is a schematic view showing the cross section taken along the direction AA in FIG. 3.

As shown in FIGS. 3 and 4, in the preparation of the packaging structure of the display substrate, the barriers 30 and 40 are first formed on the thin-film transistor array substrate 10. The barrier 40 is arranged on a side of the barrier 30 away from the center of the display substrate, and the height of the barrier 40 is greater than the height of the barrier 30. The thin-film transistor array substrate 10 includes a base substrate, a thin film transistor array arranged on the base substrate, and a light-emitting unit.

On the thin-film transistor array substrate 10 on which the barriers 30 and 40 are formed, a single-layer inorganic thin film 50 is prepared by chemical vapor deposition (CVD) or atomic layer deposition (ALD). The inorganic thin film 50 may be made from a material with high water and oxygen barrier properties, such as silicon nitride $SiN_x$ ($0<x\leq4/3$), silicon oxide $SiO_x$ ($0<x\leq2$), silicon oxynitride SiON and aluminium oxide $AlO_x$ ($0<x\leq3/2$).

The surface of the inorganic thin film 50 away from the thin-film transistor array substrate 10 is subjected to ultraviolet light irradiation and plasma treatment by using a mask plate, to obtain a central region 70 having high surface energy. Since the peripheral region 80 is not treated, its surface energy is lower than that of the central region 70. Specifically, the static water contact angle of the inorganic thin film 50 in the peripheral region 80 may be 42°, and the static water contact angle of the inorganic thin film 50 in the central region 70 may be 21°.

Then, the organic ink 60 is inkjet printed in the central region 70 and the peripheral region 80. After a certain leveling time, the UV curing operation is carried out. After the organic ink 60 is cured, the thickness of the organic thin film in the central region 70 is less than the thickness of the organic thin film in the peripheral region 80.

In this embodiment, after the surface of the inorganic thin film 50 is treated, there is surface energy difference between the surface of the central region 70 and the surface of the peripheral region 80 in the inorganic thin film 50. The peripheral region 80 has low surface energy, has the ability to control the flow of the organic ink 60, and blocks the organic ink 60 in the central region 70 from flowing outward, and thus can reduce the leveling distance of the organic ink 60. Since the central region 70 has relatively surface energy, the organic ink 60 has a strong flowability, can be spread and leveled quickly, and reduce the thickness and surface defects of the organic thin film after curing.

Figure 5:
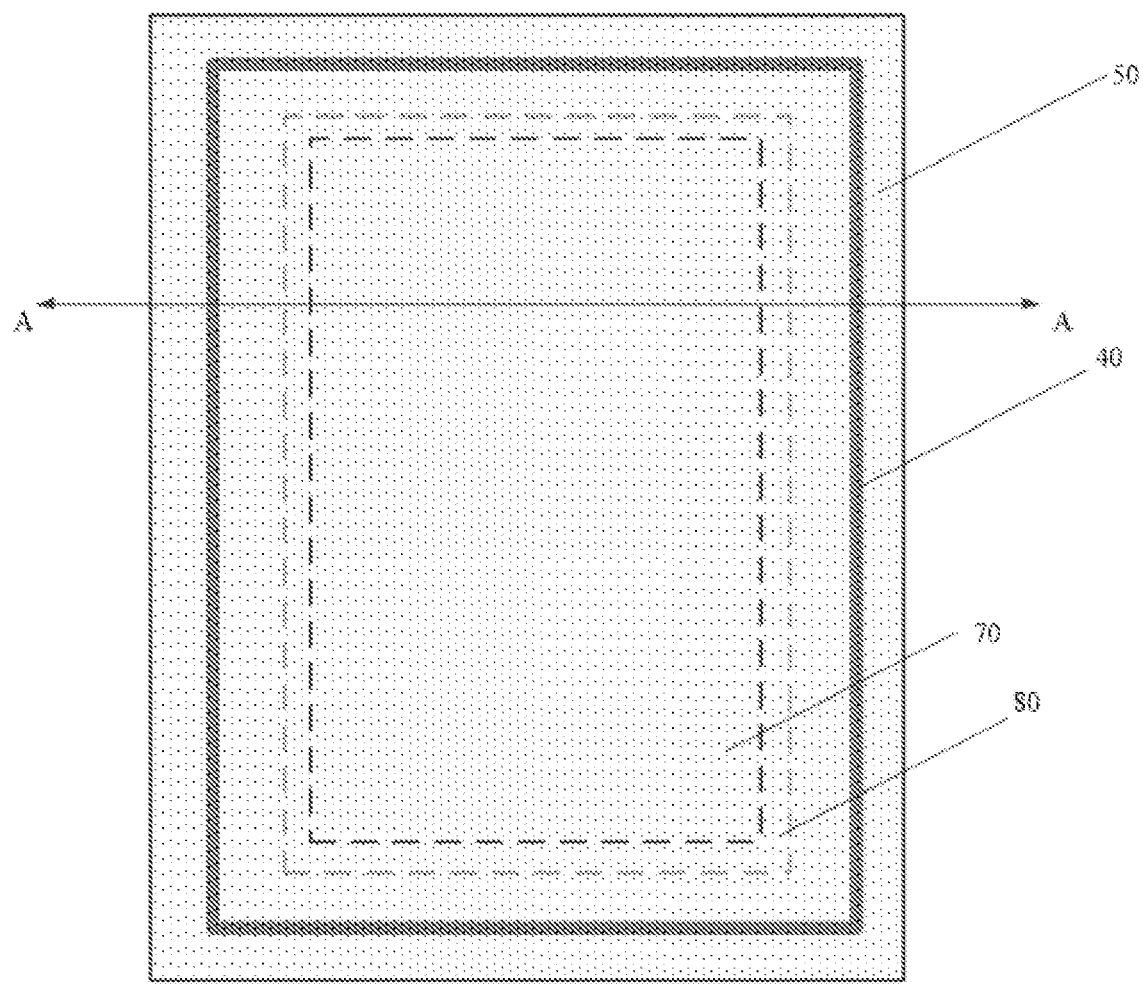
FIG. 5 is a schematic plan view showing a packaging structure for a display substrate according to another embodiment of the present disclosure.
Figure 6:
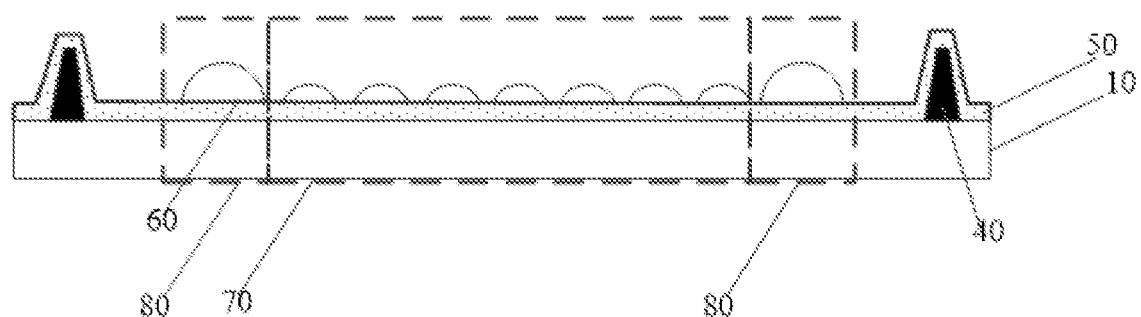
FIG. 6 is a schematic view showing the cross section taken along the direction AA in FIG. 5.

As shown in FIGS. 5 and 6, in the preparation of the packaging structure of the display substrate, the barrier 40 is first formed on the thin-film transistor array substrate 10. The thin-film transistor array substrate 10 includes a base substrate, a thin film transistor array arranged on the base substrate, and a light-emitting unit.

On the thin-film transistor array substrate 10 on which the barrier 40 is formed, a single-layer inorganic thin film 50 is prepared by CVD or ALD. The inorganic thin film 50 may be made from a material with high water and oxygen barrier properties, such as silicon nitride $SiN_x$ ($0<x\leq4/3$), silicon oxide $SiO_x$ ($0<x\leq2$), silicon oxynitride SiON and aluminium oxide $AlO_x$ ($0<x\leq3/2$).

The surface of the inorganic thin film 50 away from the thin-film transistor array substrate 10 is subjected to ultraviolet light irradiation and plasma treatment by using a mask plate, to obtain a central region 70 having relatively high surface energy. Since the peripheral region 80 is not treated, its surface energy is lower than that of the central region 70. Specifically, the static water contact angle of the inorganic thin film 50 in the peripheral region 80 may be 48°, and the static water contact angle of the inorganic thin film 50 in the central region 70 may be less than 25°.

Then, the organic ink 60 is inkjet printed in the central region 70 and the peripheral region 80. After a certain leveling time, the UV curing operation is carried out. After the organic ink 60 is cured, the thickness of the organic thin film in the central region 70 is less than the thickness of the organic thin film in the peripheral region 80.

In this embodiment, after the surface of the inorganic thin film 50 is treated, there is surface energy difference between the surface of the central region 70 and the surface of the peripheral region 80 in the inorganic thin film 50. The peripheral region 80 has low surface energy, has the ability to control the flow of the organic ink 60, and blocks the organic ink 60 in the central region 70 from flowing outward, and thus can reduce the leveling distance of the organic ink 60. Since the central region 70 has relatively surface energy, the organic ink 60 has a strong flow ability, can be spread and leveled quickly, and reduce the thickness and surface defects of the organic thin film after curing.

Since the peripheral region 80 can effectively block the organic ink 60 in the central region 70 from flowing outward, this embodiment can reduce the number of barriers and realize the extremely narrow frame design of the display substrate.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. It will be understood that when an element, such as a layer, film, region, or substrate, is referred to as being "on" or "under" another element, the element may be directly "on" or "under" another element, or there may be an intermediate element.

The above description is alternative embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A packaging structure for a display substrate, comprising a base substrate, a light-emitting device arranged on the base substrate, and a packaging thin film covering the light-emitting device,
   wherein the packaging thin film comprises an inorganic thin film and an organic thin film that are laminated, and the organic thin film is arranged on a surface of the inorganic thin film away from the base substrate, and
   wherein the packaging thin film comprises a central region and a peripheral region surrounding the central region, the inorganic thin film located in the central region has surface energy greater than that of the inorganic thin film in the peripheral region, and the organic thin film in the central region has a thickness less than that of the organic thin film in the peripheral region.

2. The package structure of claim 1, wherein an orthogonal projection of a display region of the display substrate on the base substrate falls within an orthogonal projection of the central region on the base substrate.

3. The packaging structure of claim 1, wherein the packaging structure further comprises at least one barrier structure arranged at an edge of the display substrate and surrounding the peripheral region.

4. The package structure of claim 3, wherein at least two barrier structures are arranged at the edge of the display substrate, and the barrier structures have heights increasing successively along a direction from a center of the display substrate to the peripheral region of the display substrate.

5. The package structure of claim 1, wherein a difference between a static water contact angle on the surface of the inorganic thin film in the peripheral region and a static water contact angle on the surface of the inorganic thin film in the central region is at least 15°.

6. The package structure of claim 1, wherein a static water contact angle on the surface of the inorganic thin film in the peripheral region is in a range from 40° to 50°, and a static water contact angle on the surface of the inorganic thin film in the central region is less than 30°.

7. The package structure of claim 6, wherein the static water contact angle on the surface of the inorganic thin film in the peripheral region is in a range from 45° to 50°, and the static water contact angle on the surface of the inorganic thin film in the central area is in a range from 10° to 25°.

8. The package structure of claim 1, wherein the inorganic thin film is made from at least one selected from silicon nitride $SiN_x$ ($0<x\le4/3$), silicon oxide $SiO_x$ ($0<x\le2$), silicon oxynitride SiON, or aluminium oxide $AlO_x$ ($0<x\le3/2$).

9. The package structure of claim 1, wherein the organic thin film is prepared from at least one selected from an acrylate material, an epoxy resin material, or a polyurethane material.

10. A display device, comprising the packaging structure of claim 1.

11. The display device of claim 10, wherein an orthogonal projection of a display region of the display substrate on the base substrate falls within an orthogonal projection of the central region on the base substrate.

12. A packaging method for a display substrate, comprising:
    forming an inorganic thin film on a base substrate on which a light-emitting device is formed;
    performing a treatment on a surface of the inorganic thin film, so that the inorganic thin film located in a central region has surface energy greater than that of the inorganic thin film in a peripheral region, wherein the peripheral region surrounds the central region;
    inkjet printing a rheological organic material on the inorganic thin film, wherein a static contact angle between the rheological organic material and the central region is less than a static contact angle between the rheological organic material and the peripheral region; and
    curing the rheological organic material.

13. The packaging method of claim 12, wherein the method further comprises forming at least one barrier structure on an edge of the display substrate before forming the inorganic thin film.

14. The package method of claim 13, wherein at least two barrier structures are formed at the edge of the display substrate, and the barrier structures have heights increasing successively along a direction from a center of the display substrate to the peripheral region of the display substrate.

15. The packaging method of claim 12, wherein the performing the treatment on the surface of the inorganic thin film comprises:
    placing a mask plate parallel to the base substrate on the surface of the inorganic thin film away from the base substrate, wherein the mask plate has an opening corresponding to the central region, and an orthogonal projection of the opening on the inorganic thin film coincides with the central region; and performing an ultraviolet light irradiation or a plasma treatment on the surface of the inorganic thin film covered with the mask plate, so that the inorganic thin film exposed from the opening of the mask plate is subjected to the ultraviolet light irradiation or the plasma treatment.

16. The package method of claim 12, wherein a difference between a static water contact angle on the surface of the inorganic thin film in the peripheral region and a static water contact angle on the surface of the inorganic thin film in the central region is at least 15°.

17. The package method of claim 12, wherein a static water contact angle on the surface of the inorganic thin film in the peripheral region is in a range from 40° to 50°, and a static water contact angle on the surface of the inorganic thin film in the central region is less than 30°.

18. The package method of claim 17, wherein the static water contact angle on the surface of the inorganic thin film in the peripheral region is in a range from 45° to 50°, and the static water contact angle on the surface of the inorganic thin film in the central area is in a range from 10° to 25°.

19. The package method of claim 12, wherein the inorganic thin film is made from at least one selected from silicon nitride $SiN_x$ ($0<x\leq4/3$), silicon oxide $SiO_x$ ($0<x\leq2$), silicon oxynitride SiON, or aluminium oxide $AlO_x$ ($0<x\leq3/2$).

20. The package method of claim 12, wherein the organic thin film is prepared from at least one selected from an acrylate material, an epoxy resin material, or a polyurethane material.

* * * * *